US008723776B2

(12) United States Patent
Chang et al.

(10) Patent No.: US 8,723,776 B2
(45) Date of Patent: May 13, 2014

(54) GATE DRIVING CIRCUIT RECEIVING A PLURALITY OF CLOCK SIGNALS AND HAVING FORWARD AND REVERSE DRIVING MODES AND DRIVING METHOD THEREOF

(75) Inventors: Hsien Cheng Chang, Changhua County (TW); Yan Jou Chen, Tainan County (TW)

(73) Assignee: Hannstar Display Corp., Taipei County (TW)

( * ) Notice: Subject to any disclaimer, the term of this patent is extended or adjusted under 35 U.S.C. 154(b) by 0 days.

(21) Appl. No.: 13/527,962

(22) Filed: Jun. 20, 2012

(65) Prior Publication Data

US 2012/0256899 A1    Oct. 11, 2012

Related U.S. Application Data

(62) Division of application No. 12/752,823, filed on Apr. 1, 2010, now Pat. No. 8,300,002.

(30) Foreign Application Priority Data

Apr. 8, 2009    (TW) ................................ 98111628 A

(51) Int. Cl.
G09G 3/36    (2006.01)
(52) U.S. Cl.
USPC ................................ 345/98; 345/99; 345/100

(58) Field of Classification Search
USPC ..................................................... 345/98–100
See application file for complete search history.

(56) References Cited

U.S. PATENT DOCUMENTS

| 5,859,630 A | * | 1/1999 | Huq | 345/100 |
| 2006/0071890 A1 | * | 4/2006 | Kikuchi | 345/87 |
| 2008/0219401 A1 | * | 9/2008 | Tobita | 377/79 |
| 2009/0122951 A1 | * | 5/2009 | Tobita | 377/68 |

FOREIGN PATENT DOCUMENTS

| TW | 200509037 A | 3/2005 |
| TW | 200733031 A | 9/2007 |
| TW | 200802270 A | 1/2008 |

* cited by examiner

*Primary Examiner* — Chanh Nguyen
*Assistant Examiner* — Long D Pham
(74) *Attorney, Agent, or Firm* — Lowe Hauptman & Ham, LLP

(57) ABSTRACT

A gate driving circuit receives a plurality of clock signals in a sequence and includes a plurality of cascaded drive units sequentially outputting an output signal, wherein a first-stage drive unit of the gate driving circuit receives a scan start signal or a scan end signal while a last-stage drive unit thereof receives a scan end signal or a scan start signal; wherein a driving direction of the gate driving circuit is reversed by reversing the sequence of the clock signals and exchanging the scan start signal and the scan end signal. The present invention further provides a driving method of a gate driving circuit.

9 Claims, 10 Drawing Sheets

| | $t_1$ | $t_2$ | $t_3$ |
|---|---|---|---|
| $C_{N-1}$ | H | L | L |
| $C_N$ | L | H | L |
| $C_{N+1}$ | L | L | H |
| $O_{N-1}$/STV | H | L | L |
| Z | H | H | H |
| $O_N$ | L | H | L |
| $O_{N+1}$/END | L | L | H |
| 12N1 | ON | OFF | OFF |
| 12N2 | OFF | OFF | ON |
| 12N3 | ON | ON | ON |

|  | $t_1'$ | $t_2'$ | $t_3'$ |
|---|---|---|---|
| $C_{N-1}$ | H | L | L |
| $C_N$ | L | H | L |
| $C_{N+1}$ | L | L | H |
| $O_{N+1}$/STV | H | L | L |
| Z | H | H | H |
| $O_N$ | L | H | L |
| $O_{N-1}$/END | L | L | H |
| 12N1 | OFF | OFF | ON |
| 12N2 | ON | OFF | OFF |
| 12N3 | ON | ON | ON |

|  | $T_1$ | $T_2$ | $T_3$ | $T_4$ | $T_5$ |
|---|---|---|---|---|---|
| $O_{N-2}$(END/STV) | H | L | L | L | L |
| $O_{N-1}$(STV) | L | H | L | L | L |
| $C_N$ | L | L | H | L | L |
| $O_{N+1}$(END) | L | L | L | H | L |
| $O_{N+2}$(STV/END) | L | L | L | L | H |
| Z' | L | H | H | H | L |
| $O_N$ | L | L | H | L | L |
| 12N1' | OFF | ON | OFF | OFF | OFF |
| 12N2' | OFF | OFF | OFF | OFF | ON |
| 12N3' | OFF | OFF | OFF | ON | OFF |
| 12N4' | ON | OFF | OFF | OFF | OFF |
| 12N5' | OFF | ON | ON | ON | OFF |

FIG. 7b

|  | $T_1'$ | $T_2'$ | $T_3'$ | $T_4'$ | $T_5'$ |
|---|---|---|---|---|---|
| $O_{N+2}$(END/STV) | H | L | L | L | L |
| $O_{N+1}$(STV) | L | H | L | L | L |
| $C_N$ | L | L | H | L | L |
| $O_{N-1}$(END) | L | L | L | H | L |
| $O_{N-2}$(STV/END) | L | L | L | L | H |
| $Z'$ | L | H | H | H | L |
| $O_N$ | L | L | H | L | L |
| 12N1' | OFF | OFF | OFF | ON | OFF |
| 12N2' | ON | OFF | OFF | OFF | OFF |
| 12N3' | OFF | ON | OFF | OFF | OFF |
| 12N4' | OFF | OFF | OFF | OFF | ON |
| 12N5' | OFF | ON | ON | ON | OFF |

GATE DRIVING CIRCUIT RECEIVING A PLURALITY OF CLOCK SIGNALS AND HAVING FORWARD AND REVERSE DRIVING MODES AND DRIVING METHOD THEREOF

CROSS REFERENCE TO RELATED APPLICATION

This application is a divisional of U.S. application Ser. No. 12/752,823, filed Apr. 1, 2010 and claims the priority benefit of Taiwan Patent Application Serial Number 098111628, filed on Apr. 8, 2009, the full disclosure of which is incorporated herein by reference.

BACKGROUND

1. Field of the Invention

This invention generally relates to a driving circuit and a driving method thereof and, more particularly, to a bidirectional integrated gate driving circuit and a driving method thereof.

2. Description of the Related Art

Referring to FIG. 1, a liquid crystal display 9 normally includes a pixel matrix 91, a plurality of source driving circuits 92 and a plurality of gate driving circuits 93. Generally speaking, the quality of images shown by the liquid crystal display 9 may be improved by increasing the resolution of the liquid crystal display 9. However, the number of the source driving circuits 92 and the gate driving circuits 93 will be increased at the same time thereby increasing the manufacturing cost.

In order to reduce the cost, conventionally the gate driving circuits 93 and the pixel matrix 91 of the liquid crystal display 9 may be manufactured on a same substrate so as to form an integrated gate driving circuit.

Please refer to FIGS. 2a and 2b, they respectively show a block diagram and a timing diagram of a conventional integrated gate driving circuit. The integrated gate driving circuit 93' includes a clock generator 931 configured to alternatively generate two clock signals $CK_1$ and $CK_2$, and a plurality of drive units. A first drive unit 932 is configured to receive an input signal "Input" and to output an output signal "$Output_1$", which is used for driving a row of pixel units and served as an input signal of a second drive unit 933, i.e. an output signal of each stage of the drive unit is simultaneously served as the drive signal of a row of pixel units and the input signal of a next stage of the drive unit. Accordingly, the integrated gate driving circuit 93' may output an output signal, which is served as the scan signal of the liquid crystal display 9, sequentially from the first drive unit 932 to the mth drive unit 93m.

Accompanying with the increase of the applicable range of the liquid crystal display, gate driver ICs with reversible operation function have been proposed commercially, but conventional integrated gate driving circuits do not have this function. Therefore, it is necessary to provide a bidirectional integrated gate driving circuit and a driving method thereof.

SUMMARY

The present invention provides a gate driving circuit and a driving method thereof, wherein the gate driving circuit has a symmetric circuit structure such that a driving direction of the gate driving circuit may be reversed only by reversing a sequence of the clock signals and exchanging the scan start signal and the scan end signal.

The present invention provides a gate driving circuit receiving a plurality of sequential clock signals and including a plurality of cascaded drive units sequentially outputting an output signal. Each drive unit, said an nth drive unit, includes a first switch, a second switch and a third switch. The first switch includes a control terminal, a first terminal and a second terminal; the control terminal receives a first input signal; the first terminal receives a first input signal; and the second terminal is coupled to a node. The second switch includes a control terminal, a first terminal and a second terminal; the control terminal receives a second clock signal; the first terminal is coupled to the node; and the second terminal receives a second input signal. The third switch includes a control terminal, a first terminal and a second terminal; the control terminal is coupled to the node; the first terminal receives a third clock signal; and the second terminal outputs the output signal. The first input signal and the second input signal are output signals of drive units adjacent to the nth drive unit, and the first clock signal, the third clock signal and the second clock signal are three successive clock signals following a sequence of first, third and second clock signals. A first-stage drive unit of the gate driving circuit receives a scan start signal and a last-stage drive unit of the gate driving circuit receives a scan end signal, or the first-stage drive unit receives the scan end signal and the last-stage drive unit receives the scan start signal; wherein a driving direction of the gate driving circuit may be reversed by reversing the sequence of the clock signals and exchanging the scan start signal and the scan end signal.

The present invention further provides a gate driving circuit receiving a plurality of clock signals in a sequence and including a plurality of cascaded drive units sequentially outputting an output signal. Each drive unit, said an nth drive unit, includes a first switch, a second switch, a third switch, a fourth switch and a fifth switch. The first switch includes a control terminal, a first terminal and a second terminal; the control terminal and the first terminal receive a first input signal; and the second terminal is coupled to a node. The second switch includes a control terminal, a first terminal and a second terminal; the control terminal receives a second input signal; the first terminal is coupled to the node; and the second terminal is coupled to a low voltage source. The third switch includes a control terminal, a first terminal and a second terminal; the control terminal and the first terminal receive a third input signal; and the second terminal is coupled to the node. The fourth switch includes a control terminal, a first terminal and a second terminal; the control terminal receives a fourth input signal; the first terminal is coupled to the node; and the second terminal is coupled to the low voltage source. The fifth switch includes a control terminal, a first terminal and a second terminal; the control terminal is coupled to the node; the first terminal receives a clock signal; and the second terminal outputs the output signal. The first input signal and the third input signal are output signals of drive units adjacent to the nth drive unit while the second input signal and the fourth input signal are output signals of next but one drive unit to the nth drive unit. A first-stage drive unit of the gate driving circuit receives a scan start signal and a scan end signal while a last-stage drive unit of the gate driving circuit receives the scan end signal and the scan start signal. A second-stage drive unit of the gate driving circuit receives the scan start signal and a second last-stage drive unit of the gate driving circuit receives the scan end signal, or the second-stage drive unit of the gate driving circuit receives the scan end signal and the second last-stage drive unit of the gate driving circuit receives the scan start signal; wherein a driving direction of the gate driving circuit may be reversed by reversing the sequence of the clock signals and exchanging the scan start signal and the scan end signal.

The present invention further provides a driving method of a gate driving circuit. The gate driving circuit includes a plurality of cascaded drive units sequentially outputting an output signal. The driving method includes the steps of: inputting a plurality of clock signals in a sequence into the gate driving circuit; inputting a scan start signal or a scan end signal into a first-stage drive unit of the gate driving circuit; inputting the scan end signal or the scan start signal into a last-stage drive unit of the gate driving circuit; and reversing the sequence of the clock signals and exchanging the scan start signal and the scan end signal thereby reversing a driving direction of the gate driving circuit.

The gate driving circuit of the present invention may be operated in a forward drive mode or in a backward drive mode, wherein the gate driving circuit may be easily switched between the forward and backward drive modes by inversing a sequence of the clock signals of the gate driving circuit and exchanging input signals of the first-stage drive unit and the last-stage drive unit, simultaneously, wherein an output signal of each drive unit is served as the input signal of its adjacent one or two drive units.

BRIEF DESCRIPTION OF THE DRAWINGS

Other objects, advantages, and novel features of the present invention will become more apparent from the following detailed description when taken in conjunction with the accompanying drawings.

FIG. 2b shows an operational timing diagram of the integrated gate driving circuit shown in FIG. 2a.

FIG. 5a shows a circuit diagram of a drive unit in accordance with an embodiment of the present invention, wherein the gate driving circuit is operated in a forward drive mode.

FIG. 5b shows an operational schematic diagram of the drive unit shown in FIG. 5a.

FIG. 6a shows a circuit diagram of a drive unit in accordance with an embodiment of the present invention, wherein the gate driving circuit is operated in a backward drive mode.

FIG. 6b shows an operational schematic diagram of the drive unit shown in FIG. 6a.

FIG. 7b shows an operational schematic diagram of the drive unit shown in FIG. 7a, wherein the gate driving circuit is operated in a forward drive mode.

FIG. 7c shows an operational schematic diagram of the drive unit shown in FIG. 7a, wherein the gate driving circuit is operated in a backward drive mode.

DETAILED DESCRIPTION OF THE EMBODIMENT

It should be noticed that, wherever possible, the same reference numbers will be used throughout the drawings to refer to the same or like parts.

Figure 1:
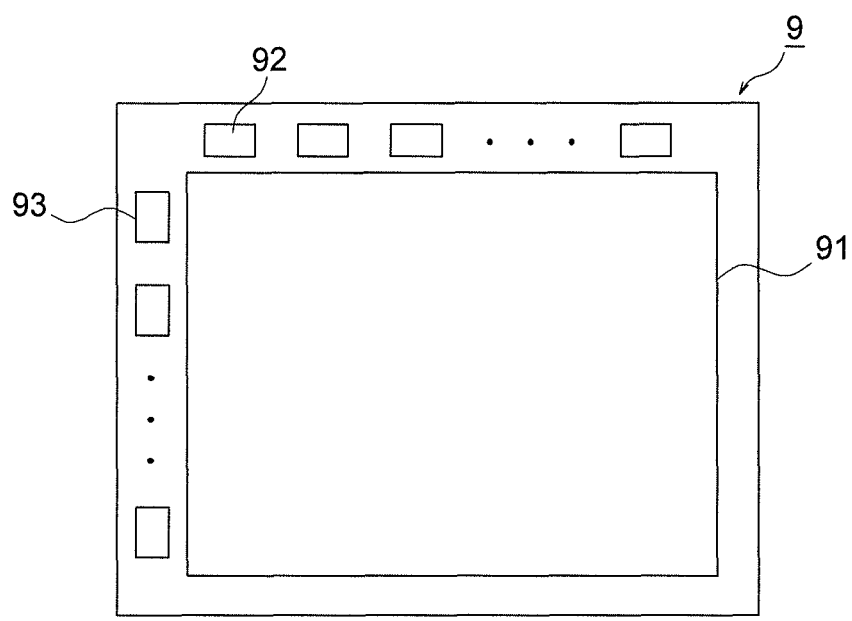
FIG. 1 shows a schematic diagram of a liquid crystal display.
Figure 2A:
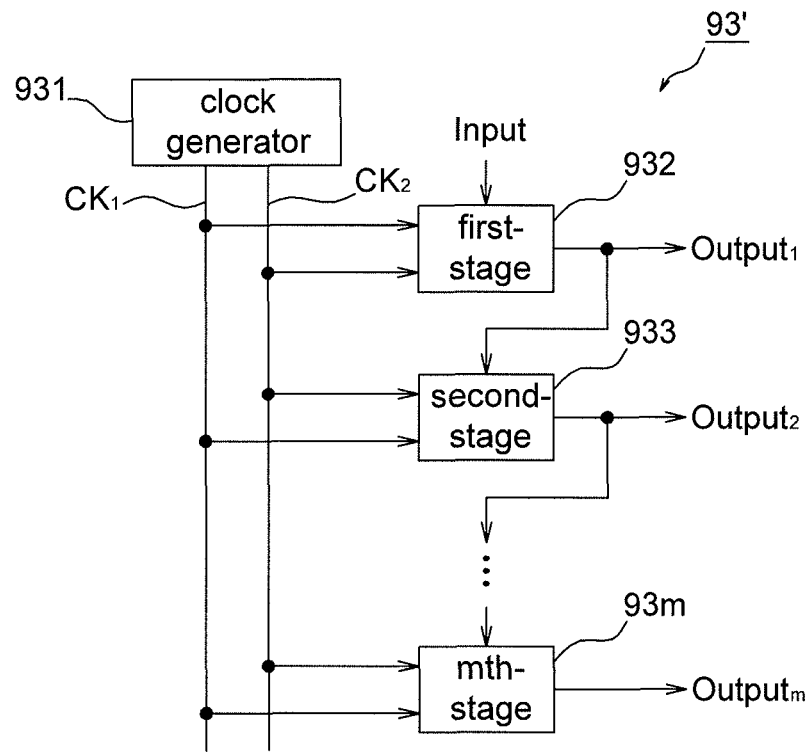
FIG. 2a shows a schematic diagram of a conventional integrated gate driving circuit.
Figure 2B:
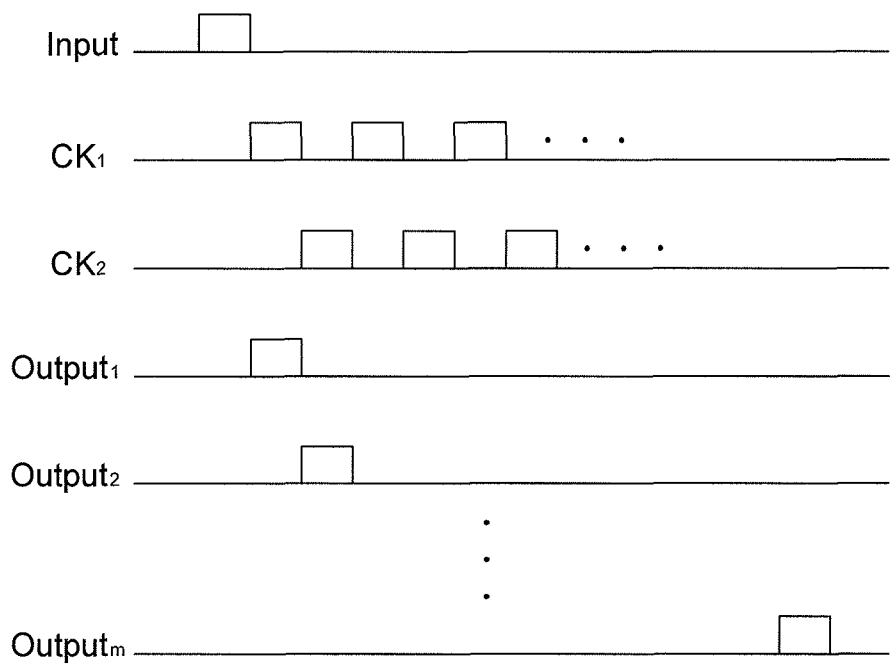
Figure 3:
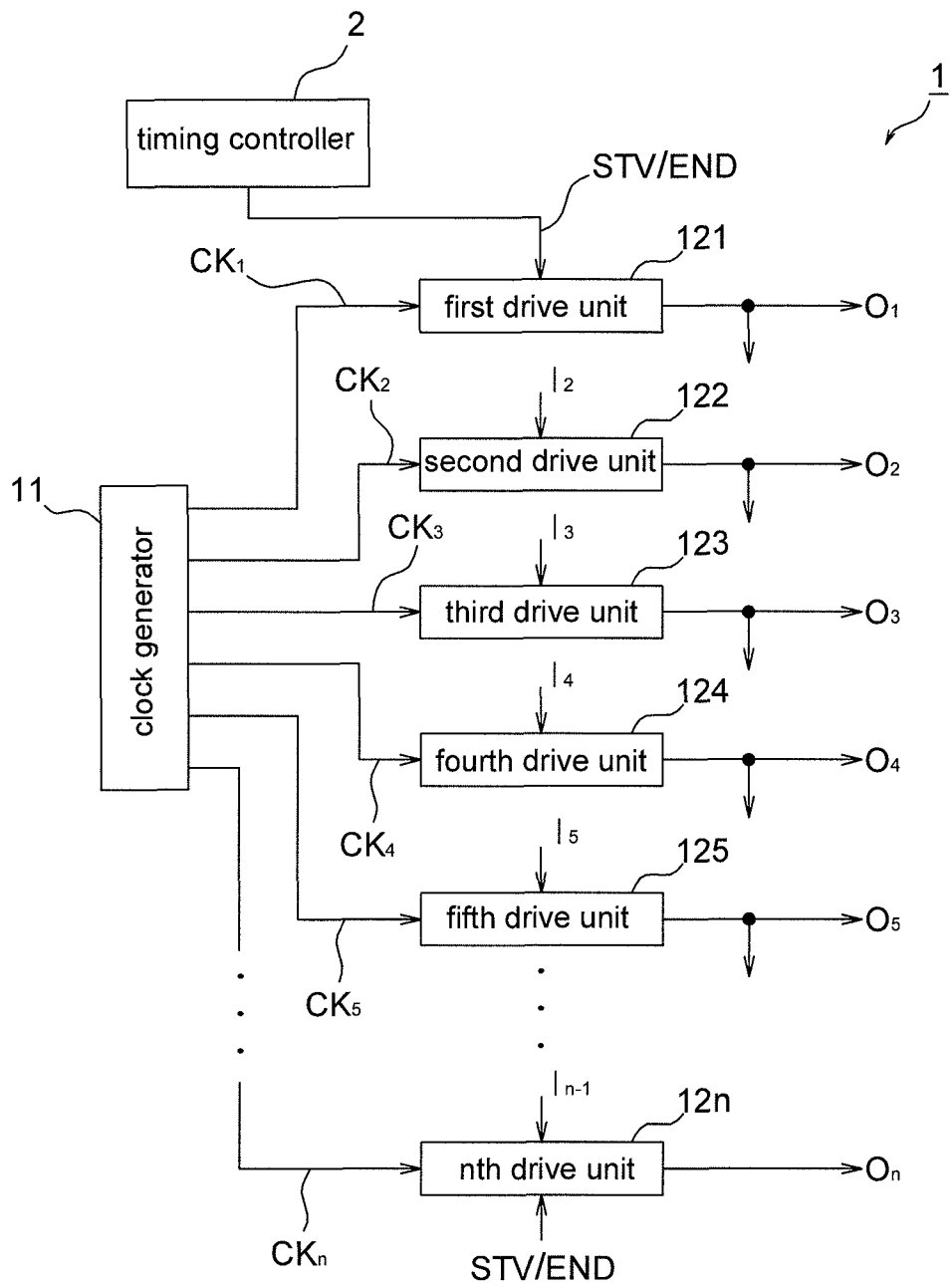
FIG. 3 shows a schematic diagram of the gate driving circuit in accordance with an embodiment of the present invention.

Please refer to FIG. 3, it shows a gate driving circuit 1 in accordance with an embodiment of the present invention. The gate driving circuit 1 includes a clock generator 11 configured to generate a plurality of sequential clock signals and a plurality of cascaded drive units, e.g. a first drive unit 121, a second drive unit 122, a third drive unit 123, a fourth drive unit 124, a fifth drive unit 125 and an nth drive unit 12n. The first drive unit 121 may be served as a first-stage drive unit or a last-stage drive unit of the gate driving circuit 1, and receives at least one clock signal $CK_1$ and a scan start signal STV (i.e. the input signal of the first-stage drive unit) or a scan end signal END (i.e. the input signal of the last-stage drive unit), and outputs a first output signal $O_1$, wherein the first output signal $O_1$ is simultaneously served as the input signal of adjacent one or two drive units of the first drive unit 121. The scan start signal STV is for enabling the gate driving circuit 1 to start one scan cycle while the scan end signal END is for enabling the gate driving circuit 1 to end one scan cycle. The second drive unit 122 receives at least one clock signal $CK_2$ and at least one input signal $I_2$, and outputs a second output signal $O_2$, wherein the input signal $I_2$ may be provided by an adjacent drive unit of the second drive unit 122 or a next but one drive unit to the second drive unit 122, and the second output signal $O_2$ may be simultaneously served as the input signal of adjacent one or two drive units of the second drive unit 122. Similarly, the third drive unit 123 receives at least one clock signal $CK_3$ and at least one input signal $I_3$, and outputs a third output signal $O_3$. The fourth drive unit 124 receives at least one clock signal $CK_4$ and at least one input signal $I_4$, and outputs a fourth output signal $O_4$. The fifth drive unit 125 receives at least one clock signal $CK_5$ and at least one input signal $I_5$, and outputs a fifth output signal $O_5$, wherein the source of the input signals $I_2$ to $I_5$ and the drive units to which the output signals $O_2$ to $O_5$ coupled will be illustrated in the following paragraphs with embodiments. The nth drive unit 12n may be served as a last-stage drive unit or a first-stage drive unit of the gate driving circuit 1, and receives at least one clock signal $CK_n$, a scan end signal END or a scan start signal STV and at least one input signal $I_{n-1}$, and outputs a nth output signal $O_n$, wherein the input signal $I_{n-1}$ may be provided by the output signal of an adjacent drive unit of the nth drive unit 12n or a next but one drive unit to the nth drive unit 12n, and the nth output signal $O_n$ may be simultaneously served as the input signal of adjacent one or two drive units of the nth drive unit 12n. In this embodiment, the scan start signal STV and the scan end signal END may be provided by a timing controller 2 or by other means. Details of the clock signals $CK_1$ to $CK_n$ will be illustrated in the following paragraphs with embodiments.

Figure 4A:
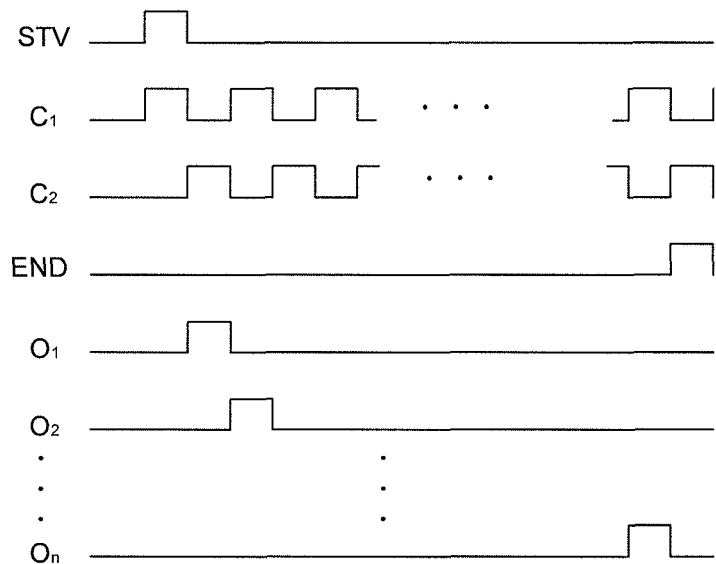
FIG. 4a shows a signal timing diagram of the gate driving circuit in accordance with the embodiment of the present invention, wherein a clock generator alternatively generates two clock signals.

Please refer to FIGS. 3 and 4a-4d together, FIGS. 4a-4d respectively show an operational timing diagram of the gate driving circuit 1 in accordance with different embodiments. Referring to FIG. 4a, in one embodiment the clock generator 11 alternatively generates two clock signals $C_1$ and $C_2$. Therefore, the drive units 121 to 12n sequentially receive the clock signals $C_1$ and $C_2$, and sequentially output an output signal $O_1$ to $O_n$, e.g. the first drive unit 121, the third drive unit 123, the fifth drive unit 125 . . . may receive the clock signal $C_1$ or the clock signal $C_2$ (i.e. the clock signals $CK_1$, $CK_3$, $CK_5$ . . . may be the clock signal $C_1$ or $C_2$). The second drive unit 122, the fourth drive unit 124 . . . may receive the clock signal $C_2$ or the clock signal $C_1$ (i.e. the clock signals $CK_2$, $CK_4$ . . . may be the clock signal $C_2$ or $C_1$), but the sequence described herein is not used to limit the present invention. In another embodiment, each of the drive units 121 to 12n may receive the clock signal $C_1$ and the clock signal $C_2$, simultaneously.

Figure 4B:
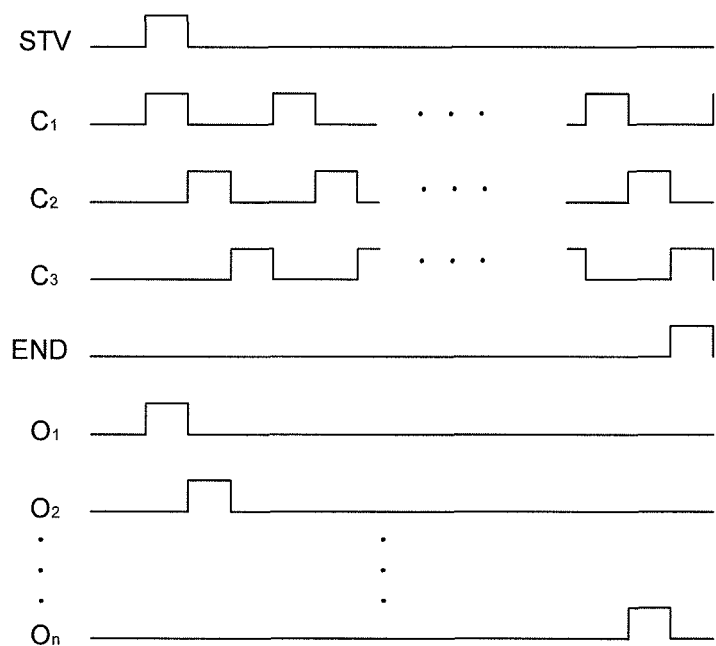
FIG. 4b shows another signal timing diagram of the gate driving circuit in accordance with the embodiment of the present invention, wherein the clock generator periodically and sequentially generates three clock signals.

Referring to FIG. 4b, in another embodiment the clock generator 11 sequentially generates three clock signals $C_1$ to $C_3$. Therefore, the drive units 121 to 12n sequentially receive the clock signals $C_1$ to $C_3$ and sequentially output an output signal $O_1$ to $O_n$. For example, the first drive unit 121, the fourth drive unit 124 . . . may receive the clock signal $C_1$. The second drive unit 122, the fifth drive unit 125 . . . may receive the clock signal $C_2$. The third drive unit 123 . . . may receive the clock signal $C_3$, but the sequence described herein is not used to limit the present invention. In another embodiment, each of the drive units 121 to 12n may receive a clock signal with other sequence or receive two or three of the clock signals $C_1$ to $C_3$, simultaneously.

Figure 4C:
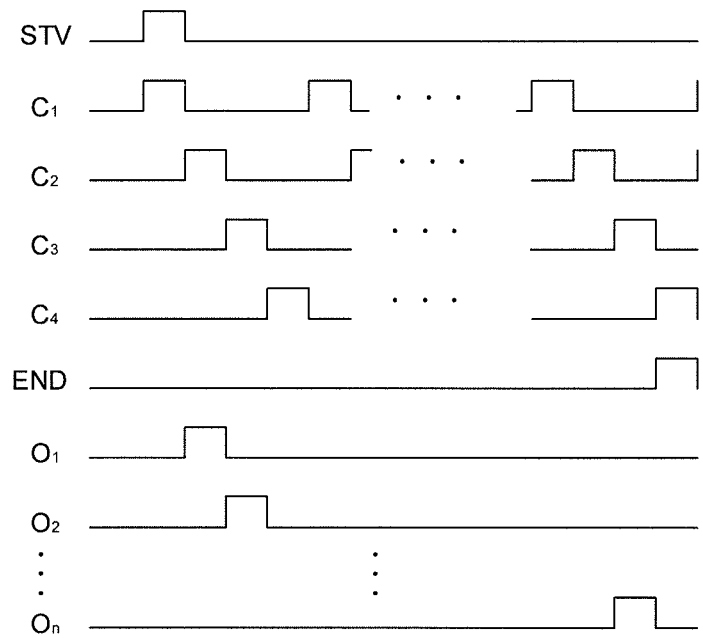
FIG. 4c shows another signal timing diagram the gate driving circuit in accordance with the embodiment of the present invention, wherein the clock generator periodically and sequentially generates four clock signals.

Referring to FIG. 4c, in another embodiment the clock generator 11 sequentially generates four clock signals $C_1$ to $C_4$. Therefore, the drive units 121 to 12n sequentially receive the clock signals $C_1$ to $C_4$, and sequentially output an output signal $O_1$ to $O_n$. For example, the first drive unit 121, the fifth drive unit 125 . . . may receive the clock signal $C_1$. The second drive unit 122 . . . may receive the clock signal $C_2$. The third drive unit 123 . . . may receive the clock signal $C_3$. The fourth drive unit 124 . . . may receive the clock signal $C_4$, but the sequence described herein is not used to limit the present invention. In another embodiment, each of the drive units 121 to 12n may receive a clock signal with other sequence or receive two or three of the clock signals $C_1$ to $C_4$, simultaneously.

Figure 4D:
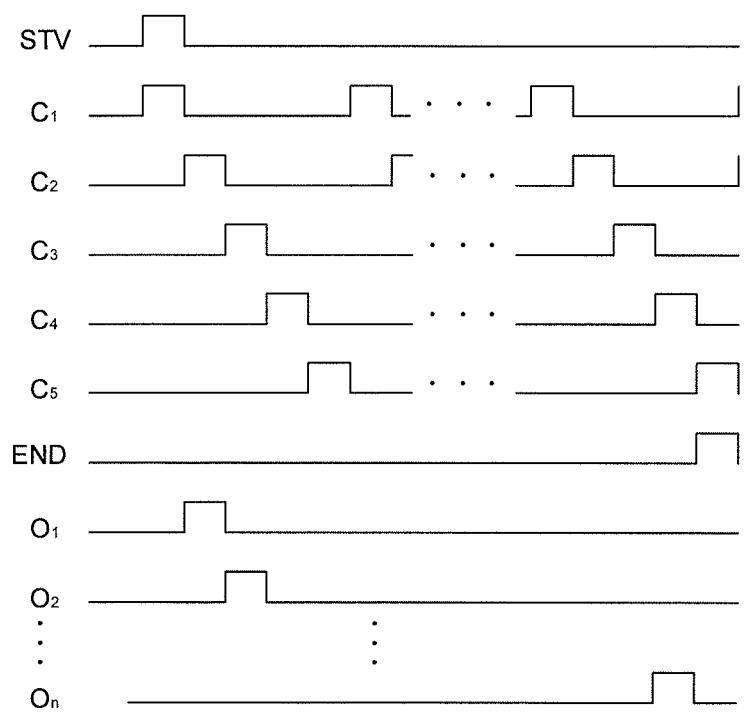
FIG. 4d shows another signal timing diagram of the gate driving circuit in accordance with the embodiment of the present invention, wherein the clock generator periodically and sequentially generates five clock signals.

Referring to FIG. 4d, in another embodiment the clock generator 11 sequentially generates five clock signals $C_1$ to $C_5$. Therefore, the drive units 121 to 12n sequentially receive the clock signals $C_1$ to $C_5$, and sequentially output an output signal $O_1$ to $O_n$. For example, the first drive unit 121, a sixth drive unit (not shown) . . . may receive the clock signal $C_1$. The second drive unit 122, a seventh drive unit (not shown) . . . may receive the clock signal $C_2$. The third drive unit 123, an eighth drive unit (not shown) . . . may receive the clock signal $C_3$. The fourth drive unit 124, a ninth drive unit (not shown) . . . may receive the clock signal $C_4$. The fifth drive unit 125, a tenth drive unit (not shown) . . . may receive the clock signal $C_5$, but the sequence described herein is not used to limit the present invention. In another embodiment, each of the drive units 121 to 12n may receive a clock signal with other sequence or receive two or three of the clock signals $C_1$ to $C_5$, simultaneously.

In one embodiment, the clock generator 11 may not be included in the gate driving circuit 1, e.g. it may be included in the timing controller 2 or other means. The number of the drive units may be determined according to the actual number of pixels. The clock signals $CK_1$ to $CK_n$ have a phase difference with each other, e.g. one clock pulse difference.

Figures 5A, 5B:
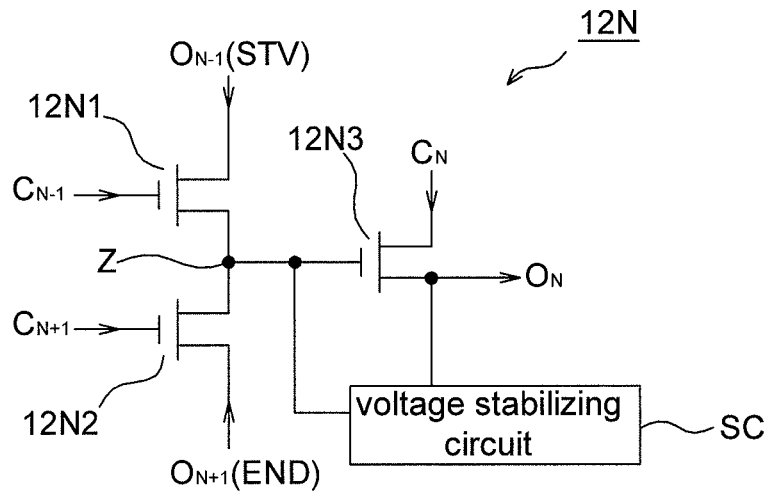

Please refer to FIGS. 3, 5a and 5b, FIGS. 5a and 5b respectively show a circuit diagram and an operational timing diagram of a drive unit in accordance with an embodiment of the present invention, wherein the "H" shown in FIG. 5b refers to a high voltage, e.g. 15 volts; and the "L" refers to a low voltage, e.g. −10 volts, but these voltage values are not used to limit the present invention. In this embodiment, the gate driving circuit 1 is operated in a forward drive mode, i.e. the first drive unit 121 is served as the first-stage drive unit of the gate driving circuit 1 and the nth drive unit 12n is served as the last-stage drive unit of the gate driving circuit 1 in FIG. 3. At this moment, the first drive unit 121 receives a scan start signal STV and the nth drive unit 12n receives a scan end signal END. A drive unit 12N receives three clock signals $C_{N-1}$, $C_N$, $C_{N+1}$ and two input signals $O_{N-1}$, $O_{N+1}$, and outputs an output signal $O_N$, wherein a high level of the clock signal $C_{N-1}$ leads a high level of the clock signal $C_N$ by one clock period, and a high level of the clock signal $C_{N-1}$ lags a high level of the clock signal $C_N$ by one clock period, wherein two adjacent clock periods have a phase difference of one clock pulse. The input signal $O_{N-1}$ is the output signal of the immediately previous stage of the drive unit 12N, and the input signal $O_{N+1}$ is the output signal of the immediately following stage of the drive unit 12N, i.e. a high level of the input signal $O_{N-1}$ is at the immediately previous clock period of a high level of the input signal $O_N$, and a high level of the input signal $O_{N+1}$ is at the immediately following clock period of a high level of the input signal $O_N$. The high level of the output signal $O_N$ occurs at the same clock period with a high level of the clock signal $C_N$ as shown in FIG. 5b. For example, when the drive unit 12N is the third drive unit 123 shown in FIG. 3, the input signal $O_{N-1}$ is $O_2$ and the input signal $O_{N+1}$ is $O_4$. When the drive unit 12N is the first drive unit 121, the input signal $O_{N-1}$ is the scan start signal STV and the input signal $O_{N+1}$ is $O_2$. When the drive unit 12N is the nth drive unit 12n, the input signal $O_{N-1}$ is $O_{n-1}$ (not shown) and the input signal $O_{N+1}$ is the scan end signal END.

The drive unit 12N includes a first switch 12N1, a second switch 12N2 and a third switch 12N3, wherein these switches may be thin film transistors or semiconductor switch elements. A control terminal of the first switch 12N1 receives the clock signal $C_{N-1}$; a first terminal thereof receives the input signal $O_{N-1}$/STV; and a second terminal thereof is coupled to a node Z. A control terminal of the second switch 12N2 receives the clock signal $C_{N+1}$; a first terminal thereof is coupled to the node Z; and a second terminal thereof receives the input signal $O_{N+1}$/END. A control terminal of the third switch 12N3 is coupled to the node Z; a first terminal thereof receives the clock signal $C_N$; and a second terminal thereof outputs the output signal $O_N$.

Please refer to FIGS. 5a and 5b together, during a first clock period $t_1$, the clock signal $C_{N-1}$ changes to a high level to turn on the first switch 12N1, and the input signal $O_{N-1}$/STV also changes to a high level. Accordingly, the node Z changes to a high level to turn on (ON) the third switch 12N3, and the clock signal $C_N$ is at a low level at this moment such that the output signal $O_N$ is also at a low level. During this period, since the clock signal $C_{N+1}$ is at a low level, the second switch 12N2 is turned off (OFF). The input signal $O_{N+1}$ is at a low level during this clock period.

During a second clock period $t_2$, the clock signal $C_{N-1}$ changes to a low level to turn off the first switch 12N1, and the node Z is still at a high level to continuously turn on the third switch 12N3. Since the clock signal $C_N$ changes to a high level, the output signal $O_N$ is charged to a high level. During this period, since the clock signal $C_{N+1}$ is still at a low level, the second switch 12N2 is continuously turned off. The input signal $O_{N-1}$ and $O_{N+1}$ are at a low level during this clock period.

During a third clock period $t_3$, the clock signal $C_{N-1}$ is still at a low level to continuously turn off the first switch 12N1. The clock signal $C_{N+1}$ changes to a high level to turn on the second switch 12N2, and since the input signal $O_{N+1}$/END changes to a high level, the node Z is maintained at a high level. Accordingly, the third switch 12N3 is turned on continuously, and since the clock signal $C_N$ changes to a low level, the output signal $O_N$ is discharged to a low level. The input signal $O_{N-1}$ is at a low level during this period. In addition in this embodiment, the drive unit 12N may further include a voltage stabilizing circuit SC for stabilizing the output signal $O_N$.

Figures 6A, 6B:
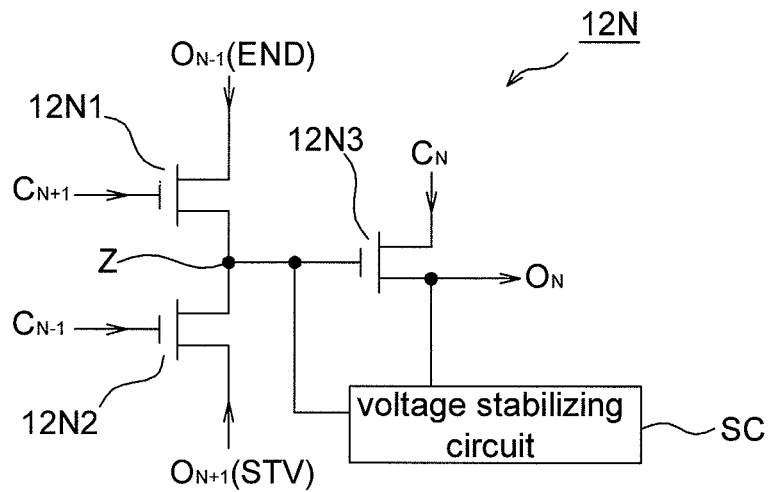

Please refer to FIGS. 3, 6a and 6b, FIGS. 6a and 6b respectively show a circuit diagram and an operational timing diagram of the drive unit operating in a backward drive mode in accordance with an embodiment of the present invention. In the backward drive mode, the nth drive unit 12n shown in FIG. 3 is served as the first-stage drive unit of the gate driving circuit 1, and the first drive unit 121 is served as the last-stage drive unit of the gate driving circuit 1. At this moment, the nth drive unit 12n receives the scan start signal STV while the first drive unit 121 receives the scan end signal END. In addition, in the gate driving circuit I, when the clock generator 1 generates an even number of clock signals, the anterior half of the clock signals are symmetrically switched with the posterior half of the clock signals. For example in FIG. 4a, the clock signal $C_1$ is switched with the clock signal $C_2$. In FIG. 4c, the clock signal $C_1$ is switched with the clock signal $C_4$, and the clock signal $C_2$ is switched with the clock signal $C_3$. When the clock generator 11 generates an odd number of clock signals, the anterior half of the clock signals are symmetrically switched with the posterior half of the clock signals and the center one is left unchanged. For example in FIG. 4b, the clock signal $C_1$ is switched with the clock signal $C_3$. In FIG. 4d, the clock signal $C_1$ is switched with the clock signal $C_5$, and the clock signal $C_2$ is switched with the clock signal $C_4$. In other words, the gate driving circuit 1 of the present invention may achieve the function of bidirectional driving by exchanging the scan start signal STV and the scan end signal END, and by reversing a sequence of the clock signals generated by the clock generator 11 simultaneously.

Please refer to FIGS. 6a and 6b again, when the gate driving circuit 1 is operated in the backward drive mode, the control terminal of the first switch 12N1 receives the clock signal $C_{N+1}$, and the control terminal of the second switch 12N2 receives the clock signal $C_{N-1}$. During a first clock period $t_1'$, the clock signal $C_{N-1}$ changes to a high level to turn on the second switch 12N2, and the input signal $O_{N-1}$/STV changes to a high level. Accordingly, since the node Z changes to a high level to turn on the third switch 12N3 and the clock signal $C_N$ is at a low level now, the output signal is $O_N$ at a low level. During this period, since the clock signal $C_{N+1}$ is at a low level, the first switch 12N1 is turned off. The input signal $O_{N-1}$ is at a low level during this clock period.

During a second clock period $t_2'$, the clock signal $C_{N-1}$ changes to a low level to turn off the second switch 12N2. The voltage of the node Z is still at a high level to continuously turn on the third switch 12N3, and since the clock signal $C_N$ changes to a high level, the output signal $O_N$ is charged to a high level. During this period, since the clock signal $C_{N+1}$ is maintained at a low level, the first switch 12N1 is continuously turned off. The input signal $O_{N-1}$ and $O_{N+1}$ are both at a low level during this clock period.

During a third clock period $t_3'$, the clock signal $C_{N-1}$ is at a low level to continuously turn off the second switch 12N2. The clock signal $C_{N+1}$ changes to a high level to turn on the first switch 12N1, and since the input signal $O_{N-1}$/END changes to a high level, the node Z is continuously at a high level. Accordingly, the third switch 12N3 is continuously turned on and since the clock signal $C_N$ changes to a low level during this period, the output signal $O_N$ is discharged to a low level. The input signal $O_{N-1}$ is at a low level during this clock period.

Figure 7A:
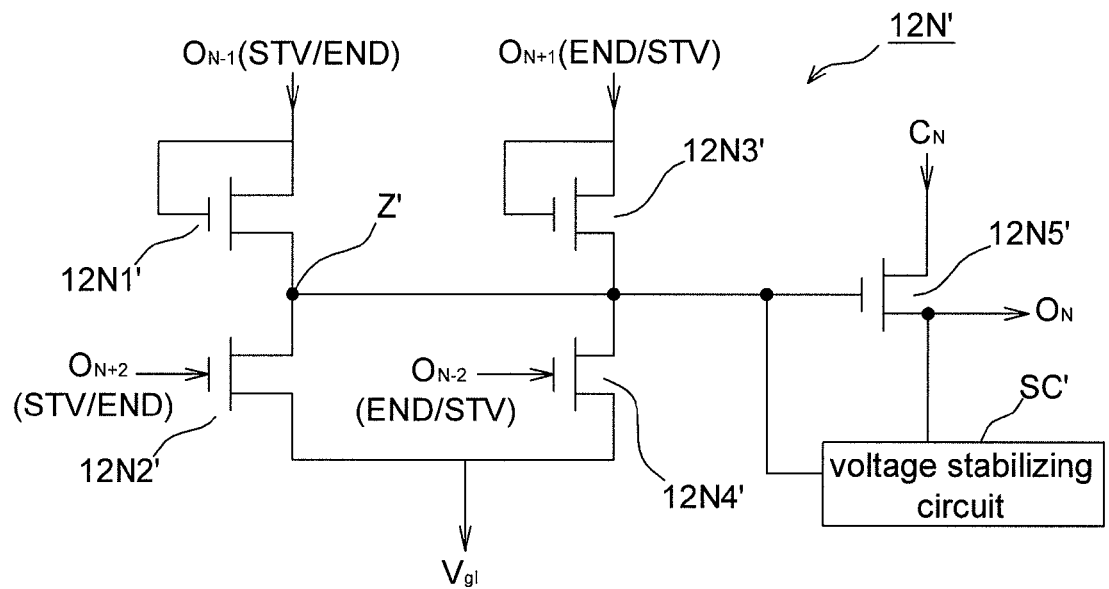
FIG. 7a shows a circuit diagram of a drive unit in accordance with an alternative embodiment of the present invention.

Please refer to FIGS. 3 and 7a, FIG. 7a shows a circuit diagram of a drive unit 12N' in accordance with another embodiment of the present invention. The drive unit 12N' receives an input signal $O_{N-2}$(END/STN), an input signal $O_{N-1}$(STV/END), an input signal $O_{N+1}$ (END/STN), an input signal $O_{N+2}$ (STV/END) and a clock signal $C_N$, and outputs an output signal $O_N$, wherein the input signals $O_{N-2}$ and $O_{N+2}$ are output signals of next but one drive unit to the drive unit 12N'; the input signals $O_{N-1}$ and $O_{N+1}$ are output signals of the adjacent drive units of the drive unit 12N'. A high level of the output signal $O_N$ and a high level of the clock $C_N$ occur in the same clock period. The drive unit 12N' includes a first switch 12N1', a second switch 12N2', a third switch 12N3', a fourth switch 12N4' and a fifth switch 12N5', wherein these switches may be thin film transistors or semiconductor switch elements. A control terminal and a first terminal of the first switch 12N1' receive the input signal $O_{N-1}$, and a second terminal thereof is coupled to a node Z'. A control terminal of the second switch receives the input signal $O_{N+2}$; a first terminal thereof is coupled to the node Z'; and a second terminal thereof is coupled to a low voltage source Vgl served as a discharge path. A control terminal and a first terminal of the third switch 12N3' receive the input signal $O_{N+1}$, and a second terminal thereof is coupled to the node Z'. A control terminal of the fourth switch 12N4' receives the input signal $O_{N-2}$; a first terminal thereof is coupled to the node Z'; and a second terminal thereof is coupled to the low voltage source Vgl served as a discharge path. A control terminal of the fifth switch 12N5' is coupled to the node Z'; a first terminal thereof receives the clock signal $C_N$; and a second terminal thereof outputs the output signal $O_N$. In this embodiment, the drive unit 12N' may further include a voltage stabilizing circuit SC' for stabilizing the output signal $O_N$.

Please refer to FIGS. 7a and 7b, FIG. 7b shows an operational timing diagram of the drive unit 12N' operating in a forward drive mode, i.e. the gate driving circuit 1 starts to sequentially output an output signal from the first drive unit 121 shown in FIG. 3. At this moment, the input signal $O_{N-2}$ is an output signal of the second previous drive unit before the drive unit 12N'; the input signal $O_{N-1}$ is an output signal of the immediately previous drive unit of the drive unit 12N'; the input signal $O_{N+1}$ is an output signal of the immediately following drive unit of the drive unit 12N'; and the input signal $O_{N+2}$ is an output signal of the second following drive unit after the drive unit 12N'. In addition, when the drive unit 12N' is the first-stage drive unit (e.g. the first drive unit 121) of the gate driving circuit 1, the input signal $O_{N-2}$ is the scan end signal END and the input signal $O_{N-1}$ is the scan start signal STV. When the drive unit 12N' is the second-stage drive unit (e.g. the second drive unit 122) of the gate driving circuit 1, the input signal $O_{N-2}$ is the scan start signal STV. When the drive unit 12N' is the second last-stage drive unit (e.g. the n−1th drive unit) of the gate driving circuit 1, the input signal $O_{N+1}$ is the scan end signal END. When the drive unit 12N' is the last-stage drive unit (e.g. the nth drive unit 12n) of the gate driving circuit 1, the input signal $O_{N+2}$ is the scan start signal STV and the input signal $O_{N+1}$ is the scan end signal END.

During a first clock period $T_1$, the input signal $O_{N-2}$ changes to a high level to turn on the fourth switch 12N4'. Accordingly, the node Z' discharges to the low voltage source Vgl to a low level to turn off the fifth switch 12N5'. The output signal $O_N$ is at a low level. The control terminals of the first switch 12N1', the second switch 12N2', and the third switch 12N3' are all at a low level such that these switches are at an OFF state.

During a second clock period $T_2$, the input signal $O_{N+2}$ changes to a low level to turn off the fourth switch 12N4'. The input signal $O_{N-1}$ changes to a high level to turn on the first switch 12N1', such that the voltage of the node Z' changes to a high level to turn on the fifth switch 12N5'. Since the clock signal $C_N$ is at a high level during this period, the output signal $O_N$ is continuously at a low level. The control terminals of the second switch 12N2' and the third switch 12N3' are all at a low level such that these switches are at an OFF state.

During a third clock period $T_3$, the input signal $O_{N-2}$ is still at a low level to turn off the fourth switch 12N4'. The input signal $O_{N-1}$ changes to a low level to turn off the first switch 12N1'. The voltage of the node Z' is still at a high level to turn on the fifth switch 12N5', and since the clock signal $C_N$ changes to a high level during this period, the output signal $O_N$ is charged to a high level. The control terminals of the second switch 12N2' and the third switch 12N3' are continuously at a low level such that these switches are at an OFF state.

During a fourth clock period $T_4$, the input signal $O_{N-2}$ is still at a low level to turn off the fourth switch 12N4'. The input signal $O_{N-1}$ is continuously at a low level to turn off the first switch 12N1'. During this period, the input signal $O_{N+1}$ changes to a high level to turn on the third switch 12N3' and the voltage of the node Z' is continuously at a high level to turn on the fifth switch 12N5'. Since the clock signal $C_N$ changes to a low level during this period, the output signal $O_N$ is discharged to a low level. The control terminal of the second switch 12N2' is still at a low level such that this switch is at an OFF state.

During a fifth clock period $T_5$, the input signal $O_{N-2}$ is continuously at a low level to turn off the fourth switch 12N4'. The input signal $O_{N-1}$ is continuously at a low level to turn off the first switch 12N1'. The input signal $O_{N+1}$ changes to a low level to turn off the third switch 12N3'. During this period, the input signal $O_{N+2}$ changes to a high level to turn on the second switch 12N2' and thus the voltage of the node Z' is discharged to the low voltage source Vgl to a low level through the second switch 12N2' to turn off the fifth switch 12N5'. In this manner, the output signal $O_N$ is maintained at a low level.

The input signals and the clock signals not described in the first clock period $T_1$ to the fifth clock period $T_5$ are at a low level.

Please refer to FIGS. 7a and 7c, FIG. 7c shows an operational timing diagram of the drive unit 12N' operating in a backward drive mode, i.e. the gate driving circuit 1 starts to sequentially output an output signal from the nth drive unit 12n shown in FIG. 3. At this moment, the input signal $O_{N-2}$ is an output signal of the second following drive unit after the drive unit 12N'; the input signal $O_{N-1}$ is an output signal of the immediately following drive unit of the drive unit 12N'; the input signal $O_{N+1}$ is an output signal of the immediately previous drive unit of the drive unit 12N'; and the input signal $O_{N+2}$ is an output signal of the second previous drive unit before the drive unit 12N'. In addition, when the drive unit 12N' is the first-stage drive unit (e.g. the nth drive unit 12n) of the gate driving circuit 1, the input signal $O_{N+2}$ is the scan end signal END and the input signal $O_{N+1}$ is the scan start signal STV. When the drive unit 12N' is the second-stage drive unit (e.g. the n−1th drive unit) of the gate driving circuit 1, the input signal $O_{N+2}$ is the scan start signal STV. When the drive unit 12N' is the second last-stage drive unit (e.g. the second drive unit 122) of the gate driving circuit 1, the input signal $O_{N-2}$ is the scan end signal END. When the drive unit 12N' is the last-stage drive unit (e.g. the first drive unit 121) of the gate driving circuit 1, the input signal $O_{N-1}$ is the scan end signal END and the input signal $O_{N-2}$ is the scan start signal STV.

During a first clock period $T_1'$ the input signal $O_{N+2}$ changes to a high level to turn on the second switch 12N2'. Accordingly, the node Z' discharges to the low voltage source Vgl to a low level to turn off the fifth switch 12N5'. The output signal $O_N$ is at a low level. The control terminals of the first switch 12N1', the third switch 12N3', and the fourth switch 12N4' are all at a low level such that these switches are at an OFF state.

During a second clock period $T_2'$ the input signal $O_{N+2}$ changes to a low level to turn off the second switch 12N2'. The input signal $O_{N+1}$ changes to a high level to turn on the third switch 12N3', such that the voltage of the node Z' changes to a high level to turn on the fifth switch 12N5'. Since the clock signal $C_N$ is at a high level during this period, the output signal $O_N$ is continuously at a low level. The control terminals of the first switch 12N1' and the fourth switch 12N4' are all at a low level such that these switches are at an OFF state.

During a third clock period $T_3'$ the input signal $O_{N+2}$ is still at a low level to turn off the second switch 12N2'. The input signal $O_{N+1}$ changes to a low level to turn off the third switch 12N3'. The voltage of the node Z' is still at a high level to turn on the fifth switch 12N5', and since the clock signal $C_N$ changes to a high level during this period, the output signal $O_N$ is charged to a high level. The control terminals of the first switch 12N1' and the fourth switch 12N4' are continuously at a low level such that these switches are at an OFF state.

During a fourth clock period $T_4'$ the input signal $O_{N+2}$ is still at a low level to turn off the second switch 12N2'. The input signal $O_{N+1}$ is continuously at a low level to turn off the third switch 12N3'. During this period, the input signal $O_{N-1}$ changes to a high level to turn on the first switch 12N1', and the voltage of the node Z' is continuously at a high level to turn on the fifth switch 12N5'. Since the clock signal $C_N$ changes to a low level during this period, the output signal $O_N$ is discharged to a low level. The control terminal of the fourth switch 12N4' is still at a low level such that this switch is at an OFF state.

During a fifth clock period $T_5'$ the input signal $O_{N+2}$ is continuously at a low level to turn off the second switch 12N2'. The input signal $O_{N+1}$ is continuously at a low level to turn off the third switch 12N3'. The input signal $O_{N-1}$ changes to a low level to turn off the first switch 12N1'. During this period, the input signal $O_{N-2}$ changes to a high level to turn on the fourth switch 12N4', and thus the voltage of the node Z' is discharged to the low voltage source Vgl to a low level through the fourth switch 12N4' to turn off the fifth switch 12N5'. In this manner, the output signal $O_N$ is maintained at a low level.

In this embodiment, similarly, the function of bidirectional driving may be achieved by exchanging the scan start signal STV and the scan end signal END, and by reversing a sequence of the clock signals generated by the clock generator 11, simultaneously.

As mentioned above, as conventional gate driving circuit does not have the function of bidirectional driving, the present invention provides a bidirectional gate driving circuit (as shown in FIGS. 5a, 6a and 7a), which has a symmetric circuit structure, so as to operate incorporation with driving ICs with the function of bidirectional driving and to increase the practicability of the gate driving circuit. During operation, a driving direction may be reversed by exchanging the input signals of the first-stage drive unit and the last-stage drive unit, and by exchanging a sequence of the clock signals generated by a clock generator, simultaneously.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A gate driving circuit configured to receive a plurality of clock signals in a sequence and comprising a plurality of cascaded drive units for sequentially outputting an output signal, each nth cascaded drive unit among the plurality of cascaded drive units comprising:
   a first switch comprising a control terminal and a first terminal for receiving a first input signal, and a second terminal coupled to a node;
   a second switch comprising a control terminal for receiving a second input signal, a first terminal coupled to the node, and a second terminal coupled to a low voltage source;
   a third switch comprising a control terminal and a first terminal for receiving a third input signal, and a second terminal coupled to the node;
   a fourth switch comprising a control terminal for receiving a fourth input signal, a first terminal coupled to the node, and a second terminal coupled to the low voltage source; and
   a fifth switch comprising a control terminal coupled to the node, a first terminal for receiving a respective clock signal among the plurality of clock signals, and a second terminal for outputting the output signal,
   wherein the first input signal and the third input signal are output signals of an (n−1)th cascaded drive unit and an (n+1)th cascaded drive unit, respectively, and the second input signal and the fourth input signal are output signals of an (n−2)th cascaded drive unit and an (n+2)th cascaded drive unit, respectively,
   wherein a first-stage cascaded drive unit of the gate driving circuit is configured to receive a scan start signal and a scan end signal, while a last-stage cascaded drive unit of the gate driving circuit is configured to receive the scan end signal and the scan start signal,
   wherein
   (i) a second-stage cascaded drive unit of the gate driving circuit is configured to receive the scan start signal identical to the scan start signal received by the first-stage cascaded drive unit, wherein the scan start signal received by the first-stage cascaded drive unit and the scan start signal received by the second-stage cascaded drive unit are generated simultaneously, and a second-to-last-stage cascaded drive unit of the gate driving circuit is configured to receive the scan end signal identical to the scan end signal received by the last-stage cascaded drive unit, wherein the scan end signal received by the last-stage cascaded drive unit and the scan end signal received by the second-to-last-stage cascaded drive unit are generated simultaneously, or
   (ii) the second-stage cascaded drive unit of the gate driving circuit is configured to receive the scan end signal identical to the scan end signal received by the first-stage cascaded drive unit, and the second-to-last-stage cascaded drive unit of the gate driving circuit is configured to receive the scan start signal identical to the scan start signal received by the last-stage cascaded drive unit, and wherein a driving direction of the gate driving circuit is reversed by reversing the sequence of the clock signals and exchanging the scan start signal and the scan end signal,
   wherein in a first drive mode,
   the first input signal of the first-stage cascaded drive unit is the scan start signal while the fourth input signal of the first-stage cascaded drive unit is the scan end signal,
   the fourth input signal of the second-stage cascaded drive unit is the scan start signal,
   the second input signal of the last-stage cascaded drive unit is the scan start signal while the third input signal of the last-stage cascaded drive unit is the scan end signal, and
   the second input signal of the second-to-last-stage cascaded drive unit is the scan end signal.

2. The gate driving circuit as claimed in claim 1, wherein the first, second, third, fourth, and fifth switches are thin film transistors.

3. The gate driving circuit as claimed in claim 1, wherein each of the cascaded drive units further comprises a voltage stabilizing circuit coupled to the second terminal of the fifth switch.

4. The gate driving circuit as claimed in claim 1, wherein in a second drive mode,
   the first input signal of the first-stage cascaded drive unit is the scan end signal while the fourth input signal of the first-stage cascaded drive unit is the scan start signal,
   the fourth input signal of the second-stage cascaded drive unit is the scan end signal,
   the second input signal of the last-stage cascaded drive unit is the scan end signal while the third input signal of the last-stage cascaded drive unit is the scan start signal, and
   the second input signal of the second last-stage cascaded drive unit is the scan start signal.

5. The gate driving circuit as claimed in claim 1, wherein the scan start signal and the scan end signal are provided by a timing controller.

6. A gate driving circuit configured to receive a plurality of clock signals in a sequence from a clock generator and a scan start signal and a scan end signal from a timing controller and comprising a plurality of cascaded drive units sequentially outputting an output signal, each nth cascaded drive unit among the plurality of cascaded drive units comprising:
   a first switch comprising a control terminal and a first terminal for receiving a first input signal, and a second terminal coupled to a node;
   a second switch comprising a control terminal for receiving a second input signal, a first terminal coupled to the node, and a second terminal coupled to a low voltage source;
   a third switch comprising a control terminal and a first terminal for receiving a third input signal, and a second terminal coupled to the node;
   a fourth switch, comprising a control terminal for receiving a fourth input signal, a first terminal coupled to the node, and a second terminal coupled to the low voltage source; and
   a fifth switch comprising a control terminal coupled to the node, a first terminal for receiving a respective clock signal among the plurality of clock signals, and a second terminal outputting the output signal,
   wherein the first input signal and the third input signal are output signals of an (n−1)th cascaded drive unit and an (n+1)th cascaded drive unit, respectively, wherein a first-stage cascaded drive unit is connected to the timing controller to receive the scan start signal and the scan end signal while a last-stage cascaded drive unit is connected to the timing controller to receive the scan end signal and the scan start signal,
wherein
  (i) a second-stage cascaded drive unit is directly connected to the timing controller to receive the scan start signal, and a second last-stage cascaded drive unit is directly connected to the timing controller to receive the scan end signal, or
  (ii) the second-stage cascaded drive unit is directly connected to the timing controller to receive the scan end signal, and the second last-stage cascaded drive unit is directly connected to the timing controller to receive the scan start signal, and
wherein a driving direction of the gate driving circuit is reversed by reversing the sequence of the clock signals and exchanging the scan start signal and the scan end signal,
wherein in a first drive mode,
  the first input signal of the first-stage cascaded drive unit is the scan start signal while the fourth input signal of the first-stage cascaded drive unit is the scan end signal,
  the fourth input signal of the second-stage cascaded drive unit is the scan start signal,
  the second input signal of the last-stage cascaded drive unit is the scan start signal while the third input signal of the last-stage cascaded drive unit is the scan end signal, and
  the second input signal of the second-to-last-stage cascaded drive unit is the scan end signal.

7. The gate driving circuit as claimed in claim 6, wherein in a second drive mode,
  the first input signal of the first-stage cascaded drive unit is the scan end signal while the fourth input signal of the first-stage cascaded drive unit is the scan start signal,
  the fourth input signal of the second-stage cascaded drive unit is the scan end signal,
  the second input signal of the last-stage cascaded drive unit is the scan end signal while the third input signal of the last-stage cascaded drive unit is the scan start signal, and
  the second input signal of the second-to-last-stage cascaded drive unit is the scan start signal.

8. The gate driving circuit as claimed in claim 6, wherein the first, second, third, fourth, and fifth switches are thin film transistors.

9. The gate driving circuit as claimed in claim 6, wherein each of the cascaded drive units further comprises a voltage stabilizing circuit coupled to the second terminal of the fifth switch.

* * * * *